(12) United States Patent
Lin

(10) Patent No.: US 8,604,878 B2
(45) Date of Patent: Dec. 10, 2013

(54) FOLDED CASCODE AMPLIFIER WITH AN ENHANCED SLEW RATE

(75) Inventor: Po-Chuan Lin, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 64 days.

(21) Appl. No.: 13/474,082

(22) Filed: May 17, 2012

(65) Prior Publication Data

US 2013/0249639 A1     Sep. 26, 2013

(30) Foreign Application Priority Data

Mar. 23, 2012    (TW) .............................. 101110287 A

(51) Int. Cl.
*H03F 3/45*      (2006.01)

(52) U.S. Cl.
USPC .......................................................... 330/253

(58) Field of Classification Search
USPC .................................................. 330/252–261
See application file for complete search history.

(56) References Cited

U.S. PATENT DOCUMENTS 5,523,718 A * 6/1996 Butler ........................... 330/255

* cited by examiner

*Primary Examiner* — Robert Pascal
*Assistant Examiner* — Khiem Nguyen
(74) *Attorney, Agent, or Firm* — Huffman Law Group, P.C.

(57) ABSTRACT

The present invention is directed to a folded cascode amplifier with an enhanced slew rate, which includes a folded cascode amplifying circuit, a first input circuit and a second input circuit. The second input circuit has an electricity type opposite to that of the first input circuit. The first input circuit is connected, via its driving nodes, to the folded cascode amplifying circuit, and the second input circuit is connected, via its driving nodes, to crossover nodes of the first input circuit.

12 Claims, 8 Drawing Sheets

FOLDED CASCODE AMPLIFIER WITH AN ENHANCED SLEW RATE

BACKGROUND OF THE INVENTION

1. Field of the Invention

The present invention generally relates to a folded cascode amplifier, and more particularly to a folded cascode amplifier with an enhanced slew rate.

2. Description of Related Art

A folded cascode amplifier is one of operational transconductance amplifiers (OTA). The folded cascode amplifier has a large gain and a large signal swing, and is commonly made in a complementary metal oxide semiconductor (CMOS) integrated circuit to be a basic building block for a variety of applications.

FIG. 1A shows a circuit diagram of a conventional folded cascode amplifier, which includes a (p-type) input pair 11 made of p-type metal oxide semiconductor (PMOS) transistors M1 and M2. The slew rate (SR) of the conventional folded cascode amplifier as shown in FIG. 1A so is low such that the amplifier possesses nonlinearity characteristics. Analytically speaking, the transistor M1 is turned off and the transistor M2 is turned on when a non-inverting input voltage Vin+ is near a power VDD and an inverting input voltage Vin− is near a ground GND. As a result, an entire current $2I_b$ flows through the transistors M2 and M4. As transistors M3 and M4 form a current mirror, a current of the transistor M3 is also $2I_b$. As the transistor M1 is off, the current of the transistor M3 is provided from a path made of transistors M9, M7 and M5. Moreover, as the transistors M9 and M10 form a current mirror, a current of the transistor M10 is also $2I_b$, which charges a load capacitance C at an output node Vout via a transistor M8, therefore resulting in a slew rate $SR=2I_b/C$. An input range of the folded cascode amplifier as shown in FIG. 1A is between 0 and VDD−Vds_M0−Vt_M1.

FIG. 1B shows a circuit diagram of another conventional folded cascode amplifier, which includes an (n-type) input pair 12 made of n-type metal oxide semiconductor (NMOS) transistors Q1 and Q2. The folded cascode amplifier as shown in FIG. 1B may charge a load capacitance $C_L$ at an output node Vo, therefore resulting in a slew rate similar to that of FIG. 1A, and an input range between Vss+Vds+Vt and VDD.

FIG. 2 shows a circuit diagram of a further conventional folded cascode amplifier, which includes an n-type input pair 21 made of NMOS transistors Q1/Q2 and a p-type input pair 22 made of PMOS transistors Q3/Q4. The input range of the folded cascode amplifier as shown in FIG. 2 is between 0 and VDD, which is wider than those of FIGS. 1A and 1B. However, a slew rate of FIG. 2 is the same as that of FIGS. 1A and 1B, that is, $SR=2I_b/C$.

FIG. 3 shows a circuit diagram of a further conventional folded cascode amplifier, which has a larger transconductance, a larger gain and a larger slew rate than the folded cascode amplifiers discussed above. Analytically speaking, transistors M1a and M1b are turned off and a transistor M2a enters into a deep triode region when a non-inverting input voltage Vin+ is near a power VDD and an inverting input voltage Vin− is near a ground GND. As a result, an entire current $2I_b$ flows through transistors M2b, M11 and M3b. As transistors M3a and M3b form a current mirror and their size ratio is M3a:M3b=K:1, a current of the transistor M3a is thus $2KI_b$, which is provided from a path made of transistors M9, M7 and M5. Moreover, as the transistors M9 and M10 form a current mirror, a current of the transistor M10 is also $2KI_b$, which charges a load capacitance C at an output node Vout via a transistor M8, therefore resulting in a slew rate $SR=2KI_b/C$.

FIG. 4 shows a modified folded cascode amplifier of FIG. 3. In addition to a p-type input pair 41 made of PMOS transistors, an n-type input pair 42 made of NMOS transistors is further used. The input range of the folded cascode amplifier as shown in FIG. 4 is between 0 and VDD, which is wider than that of FIG. 3. However, a slew rate of FIG. 4 is the same as that of FIG. 3, that is, $SR=2KI_b/C$.

For the reason that the slew rates of the conventional folded cascode amplifiers are not large enough, a need has thus arisen to propose a novel folded cascode amplifier with an enhanced slew rate in order to enlarge a range of applications.

SUMMARY OF THE INVENTION

In view of the foregoing, it is an object of the embodiment of the present invention to provide a folded cascode amplifier with an enhanced slew rate to minimize nonlinearity in the amplifier. It is another object of the embodiment to increase an input range of the folded cascode amplifier to render it as a rail-to-rail amplifier.

According to one embodiment, a folded cascode amplifier with an enhanced slew rate includes a folded cascode amplifying circuit, a first input circuit, and a second input circuit. The second input circuit has an electricity (or a polarity) type opposite to the first input circuit. The first input circuit is connected, via its driving nodes, to the folded cascode amplifying circuit, and the second input circuit is connected, via its driving nodes, to crossover nodes of the first input circuit.

DETAILED DESCRIPTION OF THE INVENTION

Figure 1A:
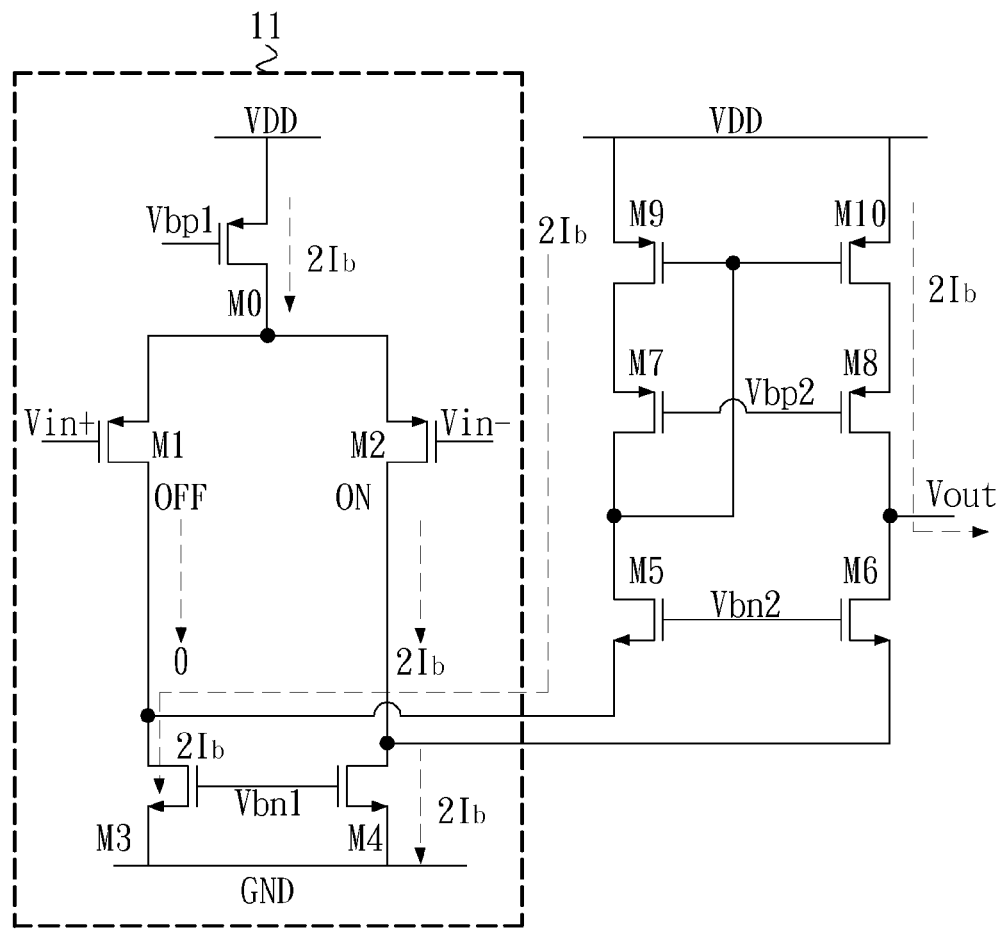
FIG. 1A to FIG. 4 show circuit diagrams of some conventional folded cascode amplifiers.
Figure 1B:
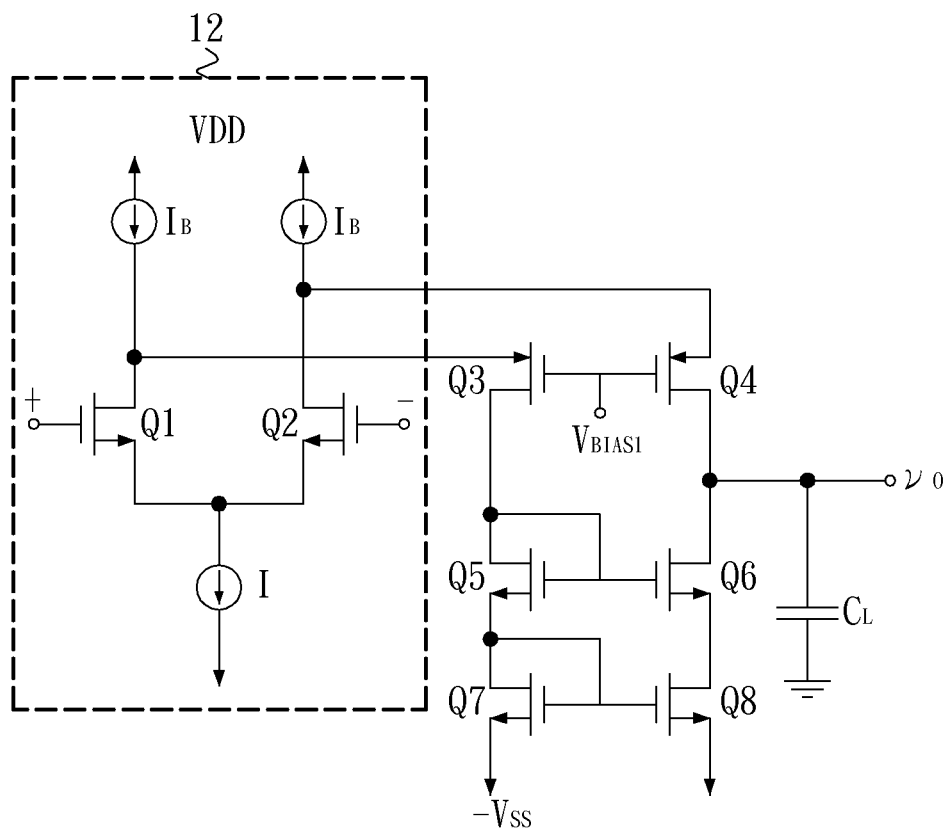
Figure 2:
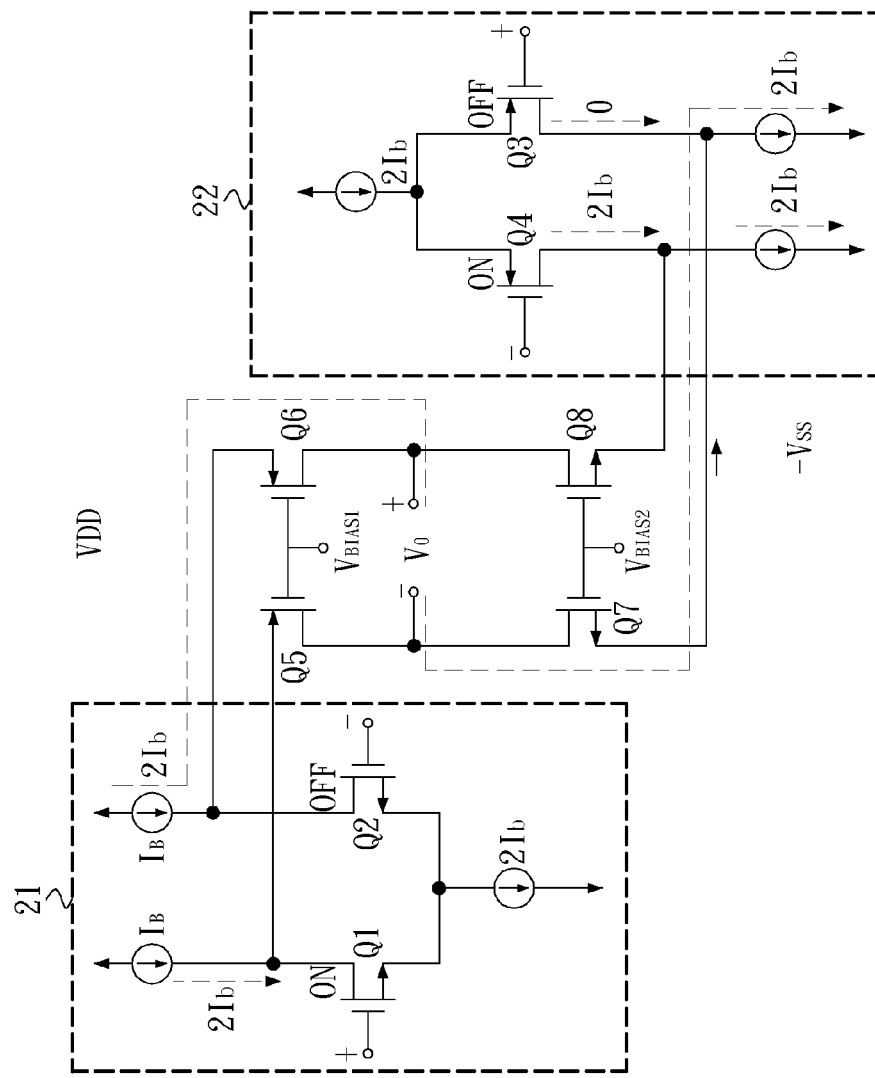
Figure 3:
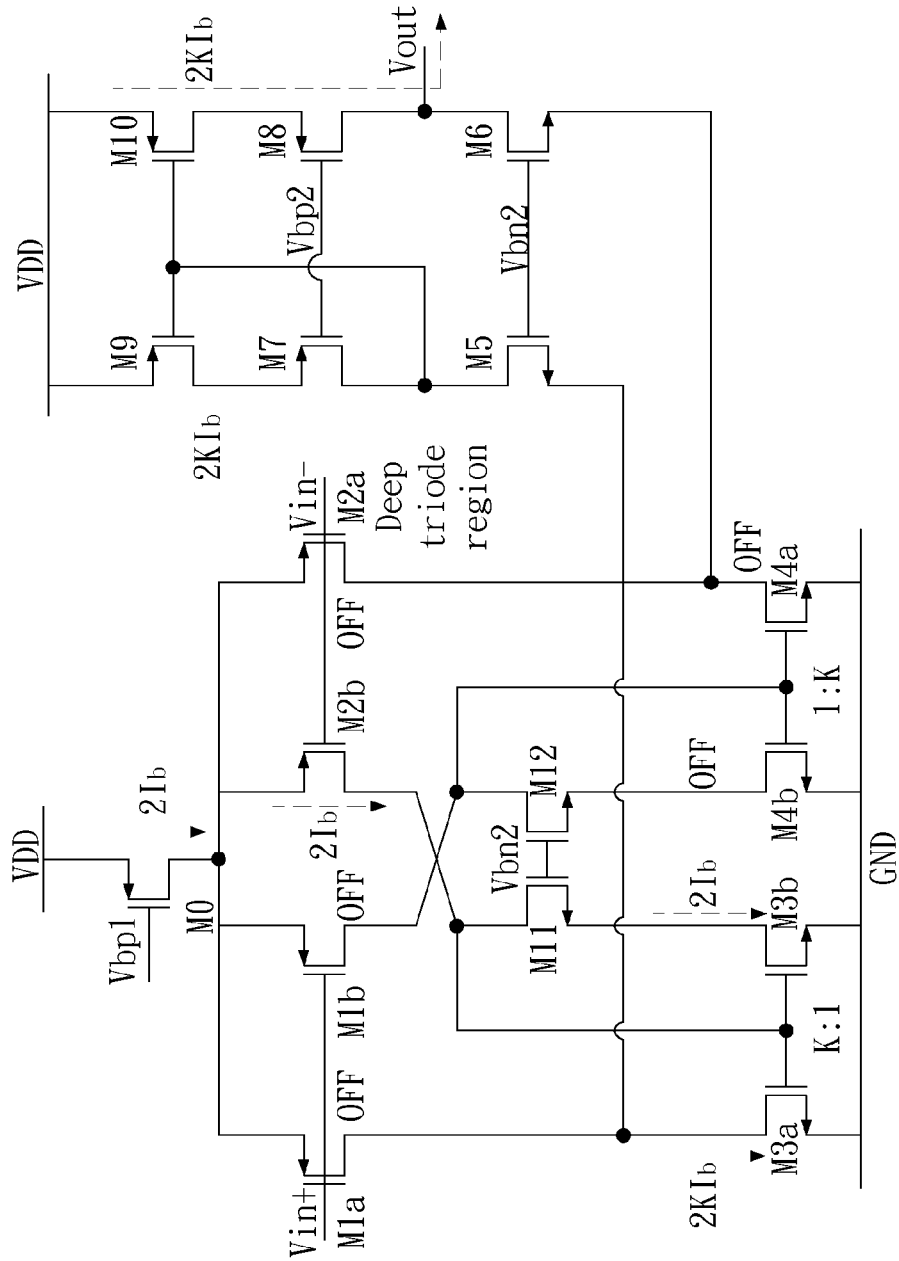
Figure 4:
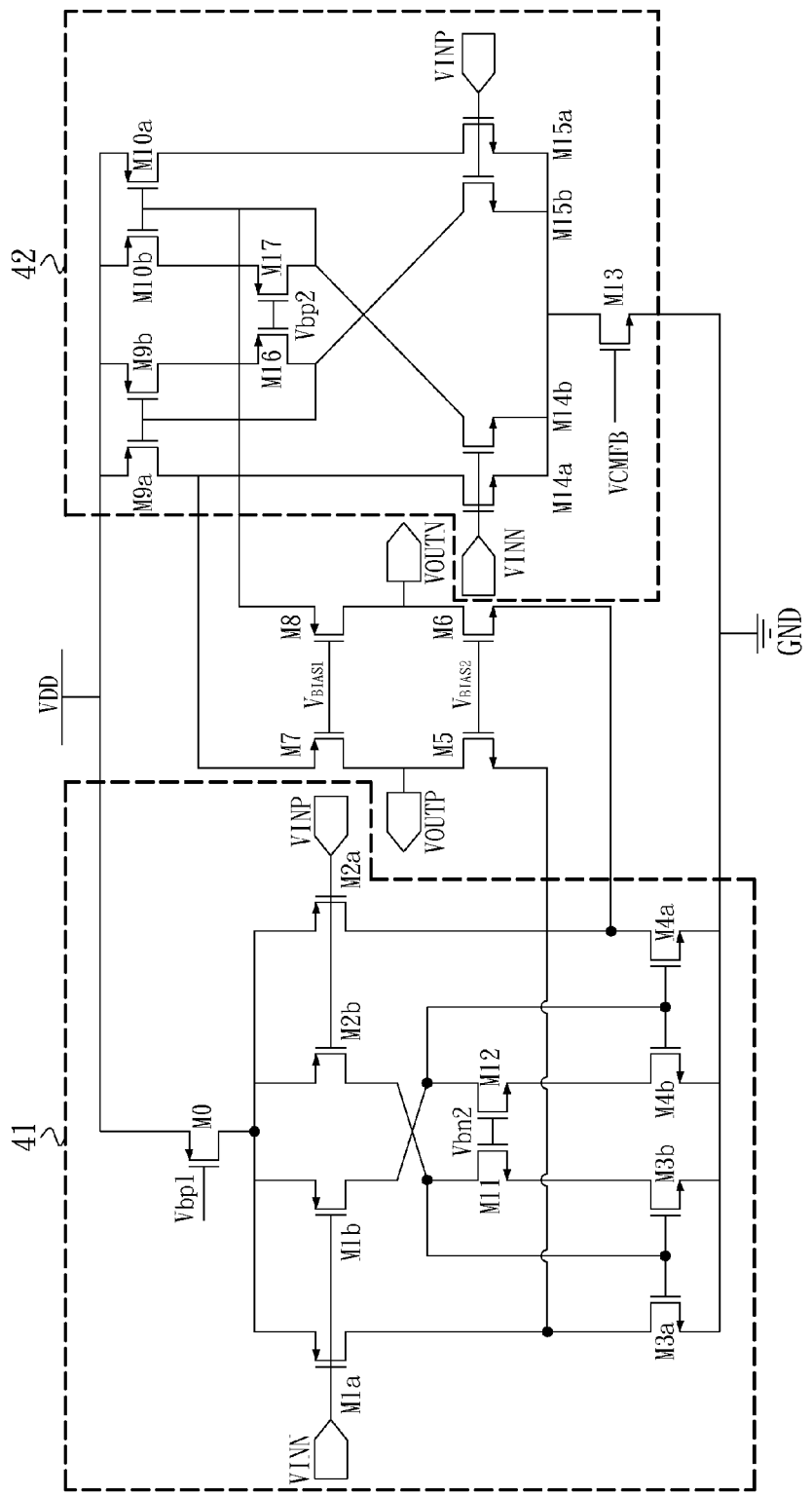
Figure 5:
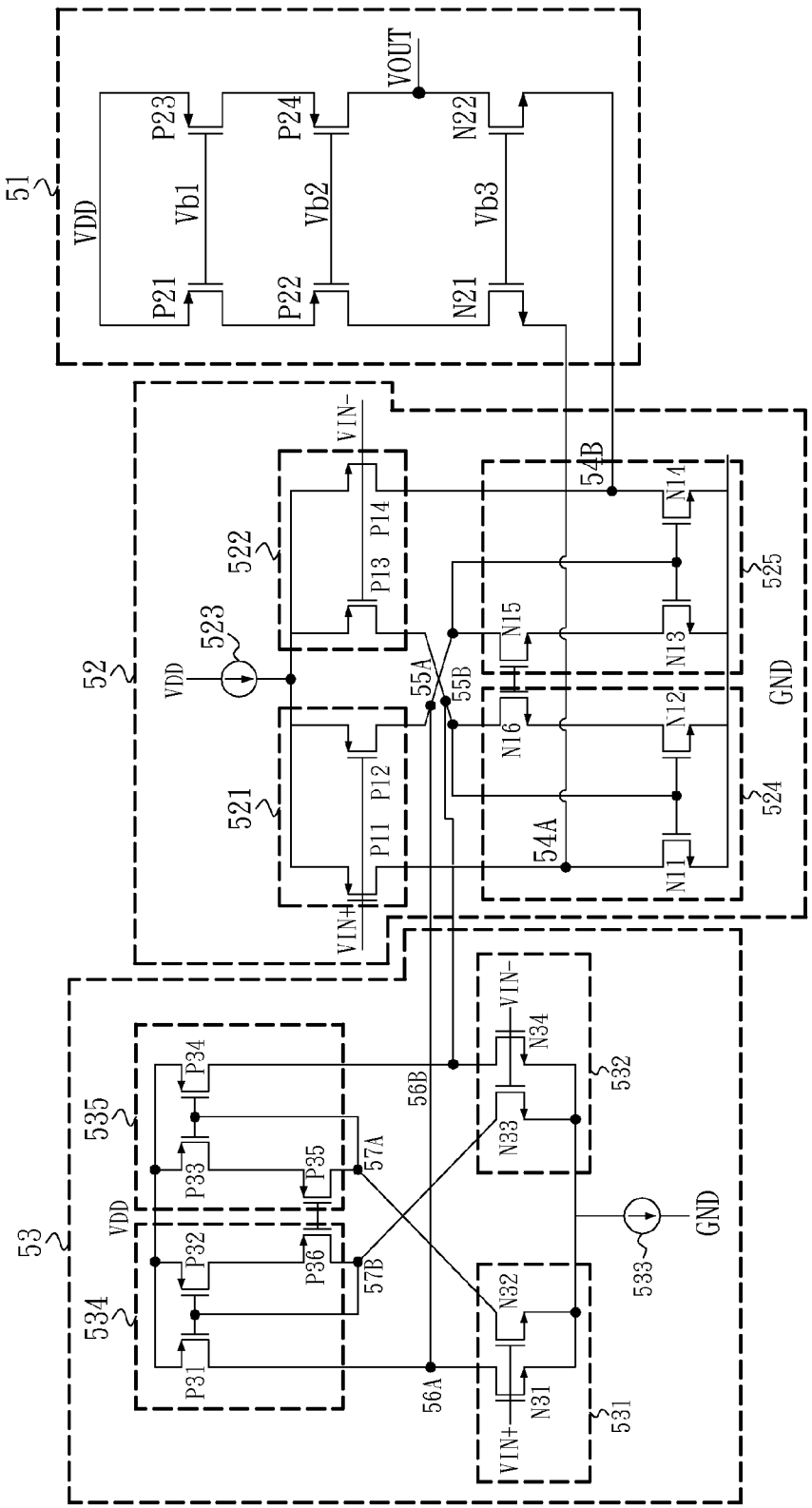
FIG. 5 shows a circuit diagram of a folded cascode amplifier with an enhanced slew rate according to one embodiment of the present invention.

FIG. 5 shows a circuit diagram of a folded cascode amplifier with an enhanced slew rate (SR) according to one embodiment of the present invention. The folded cascode amplifier of the embodiment includes a folded cascode amplifying circuit 51, a first input circuit 52 and a second input circuit 53. Specifically, the first input circuit 52 is connected, via its driving nodes 54A and 54B, to the folded cascode amplifying circuit 51; and the second input circuit 53 is connected, via its driving nodes 56A and 56B, to crossover nodes 55A and 55B of the first input circuit 51, respectively. While the folded cascode amplifying circuit 51 is made of two sub-circuits in the embodiment, the present invention is not limited to the configuration as shown. To be more specific, a first sub-circuit includes series-connected p-type metal oxide semiconductor (PMOS) transistors P21, P22 and an n-type metal oxide semiconductor (NMOS) transistor N21; and a second sub-circuit includes series-connected PMOS transistors P23, P24 and an NMOS transistor N22, with an interconnected node between the PMOS transistor P24 and the NMOS transistor N22 as an output node VOUT. Moreover, gates of the corresponding PMOS transistors or NMOS transistors between the first sub-circuit and the second sub-circuit are connected (i.e., folded), and sources of the NMOS transistors N21 and N22 are connected to the driving nodes 54A and 54B of the first input circuit 52, respectively, for sinking or draining a current.

The first input circuit 52 includes a first non-inverting input circuit 521 and a first inverting input circuit 522, and the second input circuit 53 includes a second non-inverting input circuit 531 and a second inverting circuit 532, wherein the first non-inverting/inverting input circuits 521/522 of the first input circuit 52 have an electricity (or a polarity) opposite to that of the second non-inverting/inverting input circuits 531/532 of the second input circuit 53.

As shown in FIG. 5, the first non-inverting input circuit 521 includes two PMOS transistors P11 and P12, with their gates connected to receive a non-inverting input voltage VIN+, and their sources electrically connected to a first power (e.g., VDD) via a current source 523. Similarly, the first inverting input circuit 522 includes two PMOS transistors P13 and P14, with their gates connected to receive an inverting input voltage VIN−, and their sources electrically connected to the first power (e.g., VDD) via the current source 523. In the specification, the term "electrically connected" or "electrically coupled" means that two electronic components are either directly connected via a wire, or indirectly connected via other component(s).

The first input circuit 52 also includes a first non-inverting driving circuit 524 and a first inverting driving circuit 525. Specifically, the first non-inverting driving circuit 524 includes at least two NMOS transistors N11 and N12, which form a current mirror with their gates connected and their sources electrically connected to a second power (e.g., ground GND). In the embodiment, the NMOS transistors N11 and N12 of the first non-inverting driving circuit 524 have a size ratio not equal to 1, for example, N11:N12=K:1, where K is not equal to 1. Similarly, the first inverting driving circuit 525 includes at least two NMOS transistors N13 and N14, which form a current mirror with their gates connected and their sources electrically connected to the second power (e.g., ground GND). While the first non-inverting driving circuit 524 or the first inverting driving circuit 525 as exemplified above includes one stage of current mirror, the number of current mirrors, however, may be more than one in other embodiments.

Referring to the first input circuit 52 of FIG. 5, one PMOS transistor P11 of the first non-inverting input circuit 521 has its drain electrically connected to a drain of one NMOS transistor N11 of the first non-inverting driving circuit 524, and another PMOS transistor P12 of the first non-inverting input circuit 521 has its drain electrically connected in a crossover manner, at a first crossover node 55A, to a drain of an NMOS transistor N15, which is connected to an NMOS transistor N13 in series, wherein N15 is used as a regulating transistor. Similarly, one PMOS transistor P14 of the first inverting input circuit 522 has its drain electrically connected to a drain of another NMOS transistor N14 of the first inverting driving circuit 525, and another PMOS transistor P13 of the first inverting input circuit 522 has its drain electrically connected in a crossover manner, at a second crossover node 55B, to a drain of an NMOS transistor N16, which is connected to an NMOS transistor N12 in series, wherein N16 is used as a regulating transistor. In short, the first non-inverting input circuit 521 and the first inverting input circuit 522 are electrically connected (in a non-crossover manner), via the driving nodes 54A and 54B, to the first non-inverting driving circuit 524 and the first inverting driving circuit 525, respectively. Moreover, the first non-inverting input circuit 521 and the first inverting input circuit 522 are electrically connected in a crossover manner, via the crossover nodes 55A and 55B, to the first inverting driving circuit 525 and the first non-inverting driving circuit 524, respectively.

The configuration as described above may be adapted to the second input circuit 53 with the exception that, all PMOS transistors are replaced with NMOS transistors, and all NMOS transistors are replaced with PMOS transistors. With respect to the second input circuit 53, the first power is a ground GND and the second power is VDD. In short, the second non-inverting input circuit 531 and the second inverting input circuit 532 are electrically connected (in a non-crossover manner), via the driving nodes 56A and 56B, to the second non-inverting driving circuit 534 and the second inverting driving circuit 535, respectively. Moreover, the second non-inverting input circuit 531 and the second inverting input circuit 532 are electrically connected in a crossover manner, via the crossover nodes 57A and 57B, to the second inverting driving circuit 535 and the second non-inverting driving circuit 534, respectively.

Figure 6:
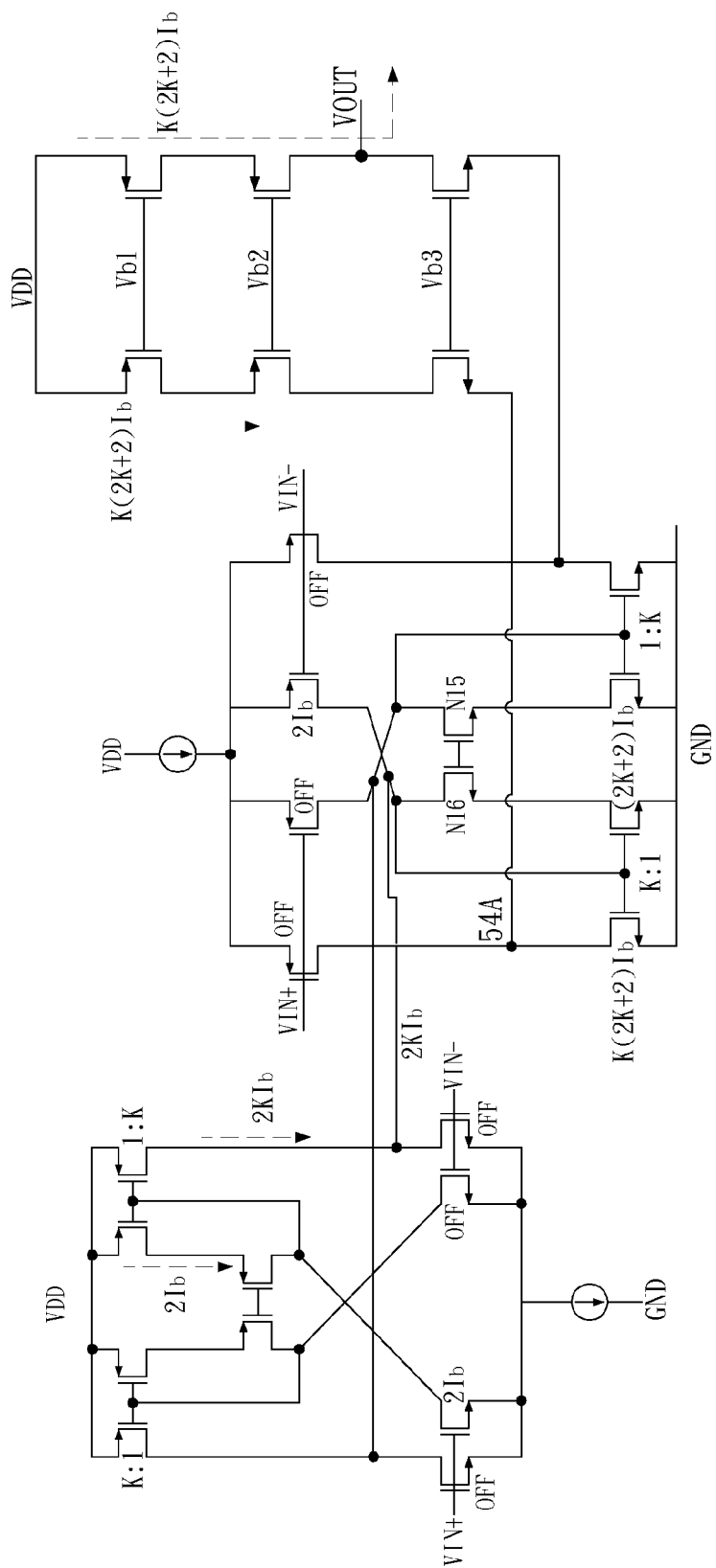
FIG. 6 demonstrates a slew rate analysis of the folded cascode amplifier of FIG. 5.

FIG. 6 demonstrates a slew rate analysis of the folded cascode amplifier of FIG. 5. With respect to the second non-inverting input circuit 531 and the second inverting input circuit 532 of the second input circuit 53, an entire current $2I_b$ flows through an NMOS transistor N32 (supposed that a current of the current source 533 is $2I_b$) when the non-inverting input voltage VIN+ is near the first power VDD and the inverting input voltage VIN− is near the second power GND. As a result, a current of a PMOS transistor P33 is also $2I_b$. As the PMOS transistors P34 and P33 form a current mirror and P34:P33=K:1, a current of the PMOS transistor P34 is $2KI_b$, which flows through an NMOS transistor N12 (via N16) because an NMOS transistor N34 is off. Similarly, with respect to the first non-inverting input circuit 521 and the first inverting input circuit 522 of the first input circuit 52, a current of a PMOS transistor P13 is $2I_b$, which also flows into the NMOS transistor N12, causing a total current of $(2K+2)I_b$ in the NMOS transistor N12. As the NMOS transistors N11 and N12 form a current mirror and N11:N12=K:1, a current of the NMOS transistor N11 is $K(2K+2)I_b$, which is provided from a PMOS transistor P21 of the folded cascode amplifying circuit 51. Moreover, as the PMOS transistors P21 and P23 form a current mirror, a current of the PMOS transistor P23 is also $K(2K+2)I_b$, which charges a load capacitance C at an output node VOUT, therefore resulting in a slew rate SR=K$(2K+2)I_b$/C, which is substantially larger than those of conventional folded cascode amplifiers (as exemplified in FIG. 1A through FIG. 4). Further, an input range of the folded cascode amplifier as shown in FIG. 5 is between VDD and GND, which is wide enough to render the amplifier as a rail-to-rail amplifier.

Figure 7:
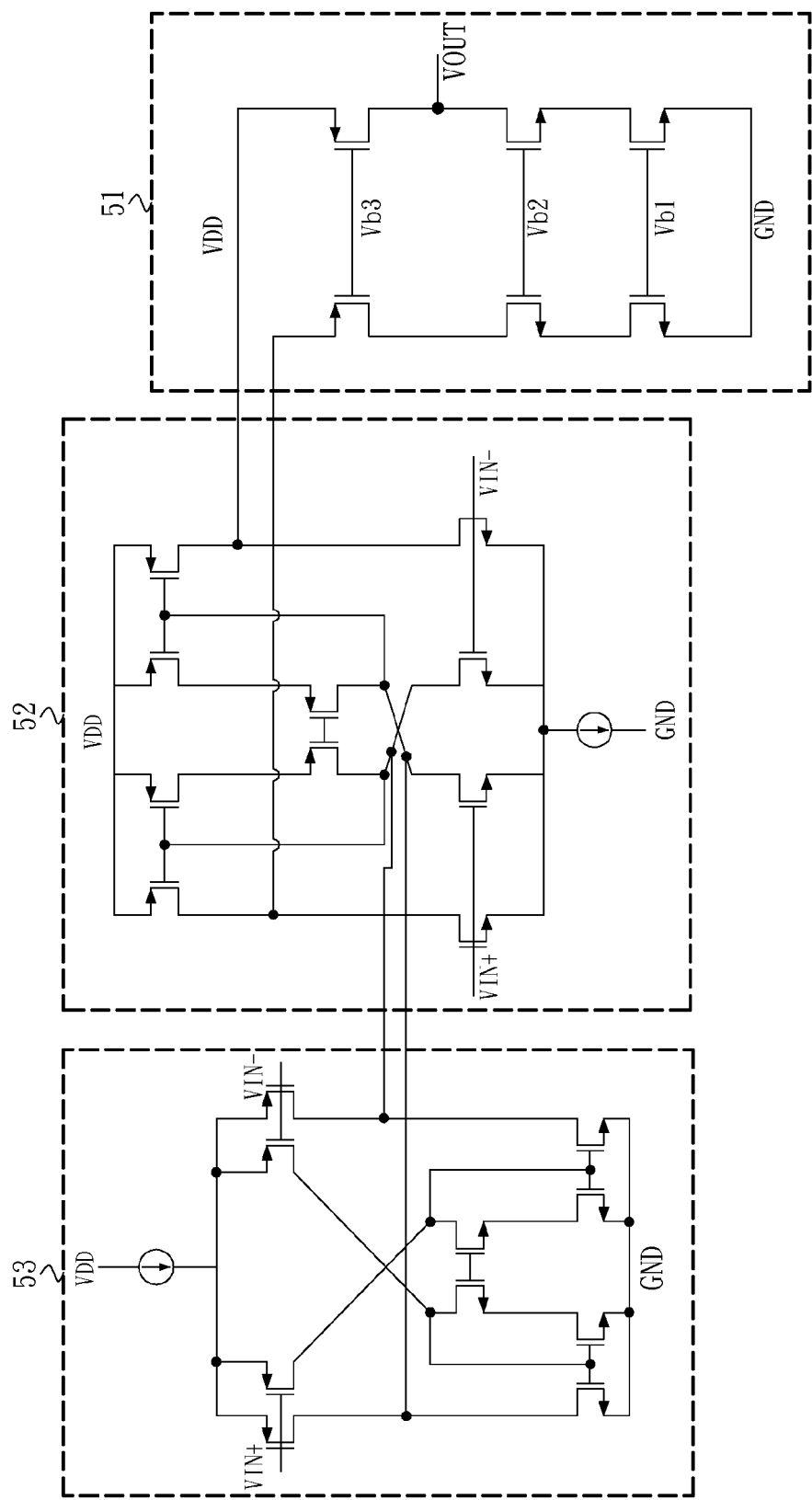
FIG. 7 shows a circuit diagram of a folded cascode amplifier with an enhanced slew rate according to another embodiment of the present invention.

FIG. 7 shows a circuit diagram of a folded cascode amplifier with an enhanced slew rate according to another embodiment of the present invention. The present embodiment has a configuration similar to that of FIG. 5 with the exception that, all PMOS transistors are replaced with NMOS transistors; all NMOS transistors are replaced with PMOS transistors; and the first power and the second power are interchanged. The slew rate analysis of the present embodiment is similar to that of FIG. 6 and is thus omitted for brevity.

Although specific embodiments have been illustrated and described, it will be appreciated by those skilled in the art that various modifications may be made without departing from the scope of the present invention, which is intended to be limited solely by the appended claims.

What is claimed is:

1. A folded cascode amplifier with an enhanced slew rate, comprising:
   a folded cascode amplifying circuit;

a first input circuit; and a second input circuit, having a polarity type opposite to the first input circuit;

wherein the first input circuit is connected, via its driving nodes, to the folded cascode amplifying circuit, and the second input circuit is connected, via its driving nodes, to crossover nodes of the first input circuit.

2. The folded cascode amplifier of claim 1, wherein the folded cascode amplifying circuit comprises:

a first sub-circuit comprising at least one PMOS transistor and at least one NMOS transistor that are connected in series; and a second sub-circuit comprising at least one PMOS transistor and at least one NMOS transistor that are connected in series, an interconnected node between the PMOS transistor and the NMOS transistor of the second sub-circuit being provided as an output node;

wherein gates of the corresponding PMOS transistors or NMOS transistors between the first sub-circuit and the second sub-circuit are connected, and sources of the NMOS transistors or the PMOS transistors of the first and the second sub-circuits are connected to the driving nodes of the first input circuit, respectively, for sinking or draining a current.

3. The folded cascode amplifier of claim 1, wherein the first input circuit comprises a first non-inverting input circuit and a first inverting input circuit, and the second input circuit comprises a second non-inverting input circuit and a second inverting input circuit, wherein the first non-inverting/inverting input circuit has a polarity type opposite to the second non-inverting/inverting input circuit.

4. The folded cascode amplifier of claim 3, wherein the first non-inverting input circuit comprises two PMOS transistors, with their gates connected to receive a non-inverting input voltage, and their sources electrically connected to a first power via a current source; and the first inverting input circuit comprises two PMOS transistors, with their gates connected to receive an inverting input voltage, and their sources electrically connected to the first power via the current source.

5. The folded cascode amplifier of claim 4, wherein the second non-inverting input circuit comprises two NMOS transistors, with their gates connected to receive a non-inverting input voltage, and their sources electrically connected to a second power via a current source; and the second inverting input circuit comprises two NMOS transistors, with their gates connected to receive an inverting input voltage, and their sources electrically connected to the second power via the current source.

6. The folded cascode amplifier of claim 4, wherein the first input circuit further comprises a first non-inverting driving circuit and a first inverting driving circuit, and the second input circuit further comprises a second non-inverting driving circuit and a second inverting driving circuit, wherein the first non-inverting/inverting driving circuit has an electricity type opposite to the second non-inverting/inverting driving circuit.

7. The folded cascode amplifier of claim 6, wherein the first non-inverting driving circuit comprises at least two NMOS transistors that form a current mirror with their gates connected and their sources electrically connected to a second power; and the first inverting driving circuit comprises at least two NMOS transistors that form a current mirror with their gates connected and their sources electrically connected to the second power.

8. The folded cascode amplifier of claim 7, wherein the two NMOS transistors of the first non-inverting driving circuit have a size ratio not equal to 1, or the two NMOS transistors of the first inverting driving circuit have a size ratio not equal to 1.

9. The folded cascode amplifier of claim 7, wherein the second non-inverting driving circuit comprises at least two PMOS transistors that form a current mirror with their gates connected and their sources electrically connected to the first power; and the second inverting driving circuit comprises at least two PMOS transistors that form a current mirror with their gates connected and their sources electrically connected to the first power.

10. The folded cascode amplifier of claim 9, wherein the two PMOS transistors of the second non-inverting driving circuit have a size ratio not equal to 1, or the two PMOS transistors of the second inverting driving circuit have a size ratio not equal to 1.

11. The folded cascode amplifier of claim 9, wherein one of the PMOS transistors of the first non-inverting input circuit has its drain electrically connected to a drain of one of the NMOS transistors of the first non-inverting driving circuit, and another of the PMOS transistors of the first non-inverting input circuit has its drain electrically connected in a crossover manner, at a first crossover node, to a drain of one of the NMOS transistors of the first inverting driving circuit via a regulating transistor of the first inverting driving circuit; and one of the PMOS transistors of the first inverting input circuit has its drain electrically connected to a drain of one of the NMOS transistors of the first inverting driving circuit, and another of the PMOS transistors of the first inverting input circuit has its drain electrically connected in a crossover manner, at a second crossover node, to a drain of one of the NMOS transistors of the first non-inverting driving circuit via a regulating transistor of the first non-inverting driving circuit.

12. The folded cascode amplifier of claim 6, wherein the first non-inverting input circuit and the first inverting input circuit are electrically connected in a non-crossover manner, via the driving nodes, to the first non-inverting driving circuit and the first inverting driving circuit, respectively; and the first non-inverting input circuit and the first inverting input circuit are electrically connected in a crossover manner, via the crossover nodes, to the first inverting driving circuit and the first non-inverting driving circuit, respectively.

* * * * *